US006922015B2

(12) United States Patent
Park et al.

(10) Patent No.: US 6,922,015 B2
(45) Date of Patent: Jul. 26, 2005

(54) ORGANIC ELECTROLUMINESCENT DISPLAY DEVICE AND METHOD OF FABRICATING THE SAME

(75) Inventors: Jae-Yong Park, Gyeonggi-do (KR); Ock-Hee Kim, Gyeonggi-do (KR); Choong-Keun Yoo, Incheon (KR); Nam-Yang Lee, Gyeonggi-do (KR); Kwan-Soo Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/329,485

(22) Filed: Dec. 27, 2002

(65) Prior Publication Data

US 2003/0201712 A1 Oct. 30, 2003

(30) Foreign Application Priority Data

Apr. 25, 2002 (KR) ................................ 10-2002-0022813

(51) Int. Cl.[7] ................................................ H05B 33/00

(52) U.S. Cl. ....................... 313/506; 313/500; 313/504; 313/505; 313/498; 315/169.3; 428/690

(58) Field of Search ................................ 313/504–506, 313/512, 500, 498; 315/169.3; 428/690

(56) References Cited

U.S. PATENT DOCUMENTS

| | | | | |
|---|---|---|---|---|
| 5,929,474 A | * | 7/1999 | Huang et al. | 257/292 |
| 6,198,220 B1 | * | 3/2001 | Jones et al. | 313/512 |
| 6,548,961 B2 | * | 4/2003 | Barth et al. | 315/169.3 |
| 6,608,449 B2 | * | 8/2003 | Fukunaga | 315/169.3 |
| 2003/0127972 A1 | * | 7/2003 | Han et al. | 313/504 |

* cited by examiner

*Primary Examiner*—Joseph Williams
*Assistant Examiner*—Sikha Roy
(74) *Attorney, Agent, or Firm*—Morgan, Lewis & Bockius LLP

(57) ABSTRACT

An organic electroluminescent display device includes a first substrate, a second substrate spaced apart from and facing the first substrate to form a space therebetween, an array element on an inner surface of the first substrate, an organic electroluminescent diode on an inner surface of the second substrate, a seal pattern along a peripheral portion between the first and second substrates, and a connection pattern electrically interconnecting the array element and the organic electroluminescent diode, wherein a pressure within the space between the first and second substrates is lower than an ambient atmospheric pressure.

9 Claims, 8 Drawing Sheets emission direction
136
132 136a 136b 136c 130 138
140 Da
134 138 134 138 134
B 122 114 122 114 122 114
112 112 112 120
124 124 124
T T T
110
Psub
P 290
270
210
230
220
240
Press
Press
222
D
270

ORGANIC ELECTROLUMINESCENT DISPLAY DEVICE AND METHOD OF FABRICATING THE SAME

The present invention claims the benefit of the Korean Patent Application No. P2002-022813 filed in Korea on Apr. 25, 2002, which is hereby incorporated by reference.

BACKGROUND OF THE INVENTION

1. Field of the Invention

The present invention relates to an electroluminescent display device, and more particularly, to an organic electroluminescence display device and a method of fabricating the same.

2. Discussion of the Related Art

In general, flat panel displays have been commonly used as display devices due to their thin profile, light weight, and low power consumption. Examples of flat panel displays include liquid crystal displays (LCDs), plasma display panels (PDPs), field emission displays (FEDs), and electroluminescent displays (ELDs). The electroluminescent displays may be categorized into inorganic electroluminescent displays (IELD) devices and organic electroluminescent display (OELD) devices depending upon source material for exciting carriers. The organic electroluminescence display (OELD) devices have high brightness, low driving voltage, and produce natural color images from the entire visible light wavelength range. In addition, the OELD devices have wide viewing angles and excellent contrast ratios because of their self-luminescence. Since the OELD devices do not require additional light sources, such as a backlight, the OELD devices have relatively small size, light weight, and low power consumption as compared with the LCD devices. Furthermore, the OELD devices may be driven by low voltage direct current (DC), and have short microsecond response times. Since the OELD devices are solid phase devices, they sufficiently withstand external impacts and have greater operational temperature ranges. In addition, the OELD devices may be manufactured at low cost. For example, only deposition and encapsulation apparatus are necessary for manufacturing the organic EL devices, thereby simplifying manufacturing processes.

The OELD devices may be classified into passive matrix-type and active matrix-type, depending upon a method for driving the devices. The passive matrix-type OELD devices do not have additional thin film transistors (TFTs), and are commonly used. The passive matrix-type OELD devices have scanning lines and signal lines that perpendicularly cross each other in a matrix shape. Since a scanning voltage is sequentially applied to the scanning lines to operate each pixel, an instantaneous brightness of each pixel during a selection period should reach a value resulting from multiplying the average brightness by the number of the scanning lines to obtain a required average brightness. Accordingly, as the number of the scanning lines increases, the applied voltage and current also increase. Thus, the passive matrix-type OELD devices are not adequate for high resolution display and large-sized areas since the devices easily deteriorate during use and power consumption is high.

Since the passive matrix-type OELD devices have many limitations in regards to image resolution, power consumption, and operational lifetime, the active matrix-type OELD devices have developed as next generation display devices for high resolution and large display area displays. In the active matrix-type OELD device, a thin film transistor (TFT) is disposed at each sub-pixel as a switching element that turns each sub-pixel ON and OFF. A first electrode connected to the TFT is turned ON/OFF by the sub-pixel, and a second electrode facing the first electrode functions as a common electrode. In addition, a voltage applied to the pixel is stored in a storage capacitor, thereby maintaining the voltage and driving the device until a voltage of next frame is applied, regardless of the number of the scanning lines. As a result, since an equivalent brightness is obtained with a low applied current, an active matrix-type OELD device having low power consumption, high resolution, and large area may be made.

FIG. 1 is an equivalent circuit diagram showing a pixel structure of an active matrix organic electroluminescent display device according to the related art. In FIG. 1, a scanning line 1 is arranged along a first direction, and a signal line 2 and a power line 3 that are spaced apart from each other are arranged along a second direction perpendicular to the first direction. The signal line 2 and the power line 3 cross the scanning line 1, thereby defining a pixel region "P." A switching TFT "$T_s$," i.e., an addressing element, is connected to the scanning line 1 and the signal line 2, and a storage capacitor "$C_{ST}$" is connected to the switching TFT "$T_S$" and the power line 3. A driving TFT "$T_D$," i.e., a current source element, is connected to the storage capacitor "$C_{ST}$" and the power line 3, and an organic EL diode "$D_{EL}$" is connected to the driving TFT "$T_D$." When a forward current is applied to the organic EL diode "$D_{EL}$," an electron and a hole are recombined to generate an electron-hole pair through the P (positive)-N (negative) junction between an anode that provides the hole and a cathode that provides the electron. The electron-hole pair has an energy that is lower than the separated electron and hole. Accordingly, an energy difference occurs between the recombination and the separated of the electron-hole pair, whereby light is emitted due to the energy difference. The switching TFT "$T_S$" adjusts the forward current through the driving TFT "$T_D$" and stores charges in the storage capacitor "$C_{ST}$."

The OELD devices are commonly categorized as top emission-type and bottom emission-type according to a direction of the emitted light.

FIG. 2 is a cross sectional view of a bottom emission-type organic electro-luminescent display device according to the related art. In FIG. 2, one pixel region is shown to include red, green and blue sub-pixel regions, and first and second substrates 10 and 30 face and are spaced apart from each other. A peripheral portion of the first and second substrates 10 and 30 are sealed with a seal pattern 40. A thin film transistor (TFT) "T" is formed at each sub-pixel region "$P_{sub}$" on an inner surface of the first substrate 10, and a first electrode 12 is connected to the TFT "T." An organic electroluminescent layer 14 includes luminescent materials of red, green, and blue is formed on the TFT "T." In addition, the first electrode 12 and a second electrode 16 are formed on the organic electroluminescent layer 14, whereby the first and second electrodes 12 and 16 apply an electric field to the organic electroluminescent layer 14. A desiccant (not shown) is formed in an inner surface of the second substrate 30 to shield from external moisture, and the desiccant is attached to the second substrate 30 by an adhesive (not shown), such as semi-transparent tape.

In the bottom emission-type OELD device, for example, the first electrode 12 functions as an anode and is made of a transparent conductive material, and the second electrode 16 functions as a cathode and is made of a metallic material of low work function. Accordingly, the organic electroluminescent layer 14 is composed of a hole injection layer 14*a*, a hole transporting layer 14*b*, an emission layer 14*c*, and an electron transporting layer 14*d* formed over the first electrode 12. The emission layer 14*c* has a structure where emissive materials of red, green, and blue are alternately disposed at each sub-pixel region "$P_{sub}$."

FIG. 3 is a cross sectional view of a sub-pixel region of a bottom emission-type organic electroluminescent display device according to the related art. In FIG. 3, a TFT "T" having a semiconductor layer 62, a gate electrode 68, and source and drain electrodes 80 and 82 is formed on a substrate 10. The source electrode 80 of the TFT "T" is connected to a storage capacitor "$C_{ST}$," and the drain electrode 82 is connected to an organic electroluminescent (EL) diode "$D_{EL}$." The storage capacitor "$C_{ST}$" includes a power electrode 72 and a capacitor electrode 64 that face each other with an insulating layer interposed between the power electrode 72 and the capacitor electrode 64, and the capacitor electrode 64 is made of the same material as the semiconductor layer 62. The TFT "T" and the storage capacitor "$C_{ST}$" are commonly referred to as array elements "A." The organic EL diode "$D_{EL}$" includes first and second electrodes 12 and 16 that face each other with an organic EL layer 14 interposed therebetween. The source electrode 80 of the TFT "T" is connected to the power electrode 72 of the storage capacitor "$C_{ST}$," and the drain electrode 82 of the TFT "T" is connected to the first electrode 12 of the organic EL diode "$D_{EL}$." In addition, the array elements "A" and the organic EL diode "$D_{EL}$" are formed on the same substrate.

FIG. 4 is a flow chart of a fabricating process of an organic electroluminescent display device according to the related art. At step ST1, array elements are formed on a first substrate that include a scanning line, a signal line, a power line, a switching TFT, and a driving TFT. The signal line and the power line cross the scanning line and are spaced apart from each other. The switching TFT is disposed at a cross of the scanning line and the signal line, while the driving TFT is disposed at a cross of the scanning line and the power line.

At step ST2, a first electrode of an organic EL diode is formed over the array elements. The first electrode is connected to the driving TFT of each sub-pixel region.

At step ST3, an organic electroluminescent layer of the organic EL diode is formed on the first electrode. If the first electrode is designed to function as an anode, the organic EL layer can be composed of a hole injection layer, a hole transporting layer, an emission layer, and an electron transporting layer.

At step ST4, a second electrode of the EL diode is formed on the organic EL layer. The second electrode is formed over an entire surface of the first substrate to function as a common electrode.

At step ST5, the first substrate is encapsulated with a second substrate. The second substrate protects the first substrate from external impact and prevents damage to the organic EL layer from any ambient air. A desiccant may be included in an inner surface of the second substrate.

The OELD device is fabricated through encapsulating the first substrate including the array elements and the organic EL diode with the second substrate. In addition, a yield of the active matrix OELD device depends on yields of the thin film transistor and the organic layer. Although the thin film transistor may adequately function, the yield of the active matrix OELD device varies due to impurities in the process of forming the organic layer to a thickness of about 1,000 Å. Accordingly, the yield of the active matrix OELD is reduced because of the impurities, and results in loss of manufacturing costs and source materials.

In addition, the active matrix OELD device is a bottom emission-type device having high stability and variable degrees of freedom during the fabrication process, but has a reduced aperture ratio. Thus, the bottom emission-type active matrix OELD device is problematic in implementation as a high aperture device. On the other hand, a top emission-type active matrix OELD has a high aperture ratio, and is easily fabricated. However, in the top emission-type active matrix OELD device, a choice of a material for the cathode electrode is limited since a cathode electrode is generally disposed over the organic layer. Accordingly, light transmittance is limited, and a luminous efficacy is reduced. Furthermore, in order to improve the transmittance, since a passivation layer should be formed in a thin film, air infiltration is not sufficiently prevented.

SUMMARY OF THE INVENTION

Accordingly, the present invention is directed to an organic electroluminescent display device and a method of fabricating the same that substantially obviates one or more of problems due to limitations and disadvantages of the related art.

An object of the present invention is to provide an organic electroluminescent display device and a method of fabricating the same that has a high aperture ratio.

Another object of the present invention is to provide an organic electroluminescent display device and a method of fabricating the same that provides for improved yield and productivity.

Another object of the present invention is to provide an organic electro-luminescent display device and a method of fabricating the same that are reliable.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes a first substrate, a second substrate spaced apart from and facing the first substrate to form a space therebetween, an array element on an inner surface of the first substrate, an organic electroluminescent diode on an inner surface of the second substrate, a seal pattern along a peripheral portion between the first and second substrates, and a connection pattern electrically interconnecting the array element and the organic electroluminescent diode, wherein a pressure within the space between the first and second substrates is lower than an ambient atmospheric pressure.

In another aspect, method of fabricating an organic electroluminescent display device includes forming an array element and connection pattern on a first substrate, forming a connection pattern electrically connected to the array element, forming an organic electroluminescent diode on a second substrate, forming a seal pattern along a peripheral portion between the first and second substrates such that the array element and the organic electroluminescent diode face each other, performing a first bonding of the first and second substrates within a vacuum chamber by pressing the seal pattern to electrically interconnect the connection pattern and the organic electroluminescent diode, the first bonding providing a first space between the first and second substrates having a first pressure less than an ambient atmospheric pressure, performing a first hardening of the seal pattern, performing a second bonding of the first and second substrate in the vacuum chamber at the ambient atmospheric pressure, and performing a second hardening of the seal pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the illustrated embodiment of the present invention, an example of which is illustrated in the accompanying drawings.

Figure 1:
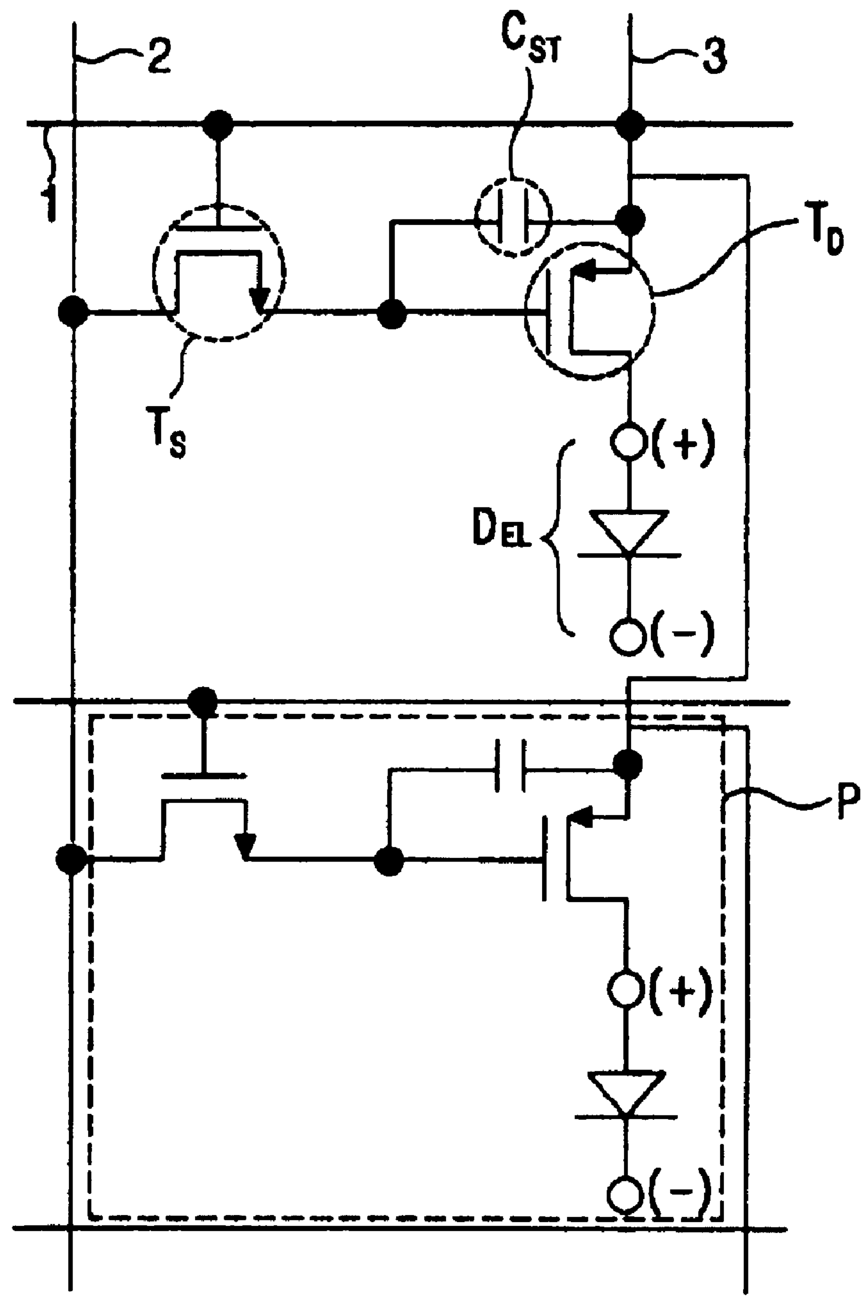
FIG. 1 is an equivalent circuit diagram showing a pixel structure of an active matrix organic electroluminescent display device according to the related art.
Figure 2:
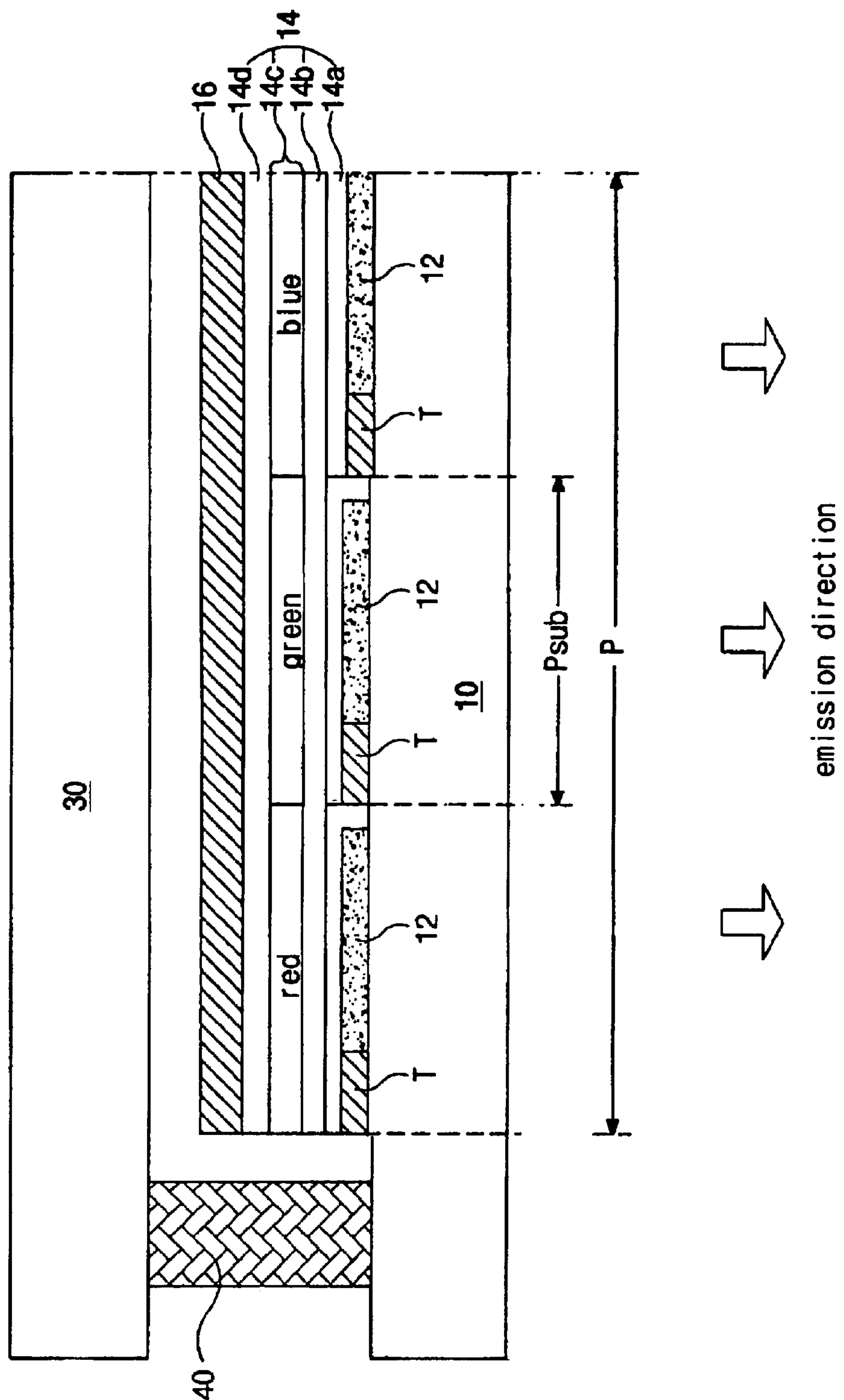
FIG. 2 is a cross sectional view of a bottom emission-type organic electro-luminescent display device according to the related art.
Figure 3:
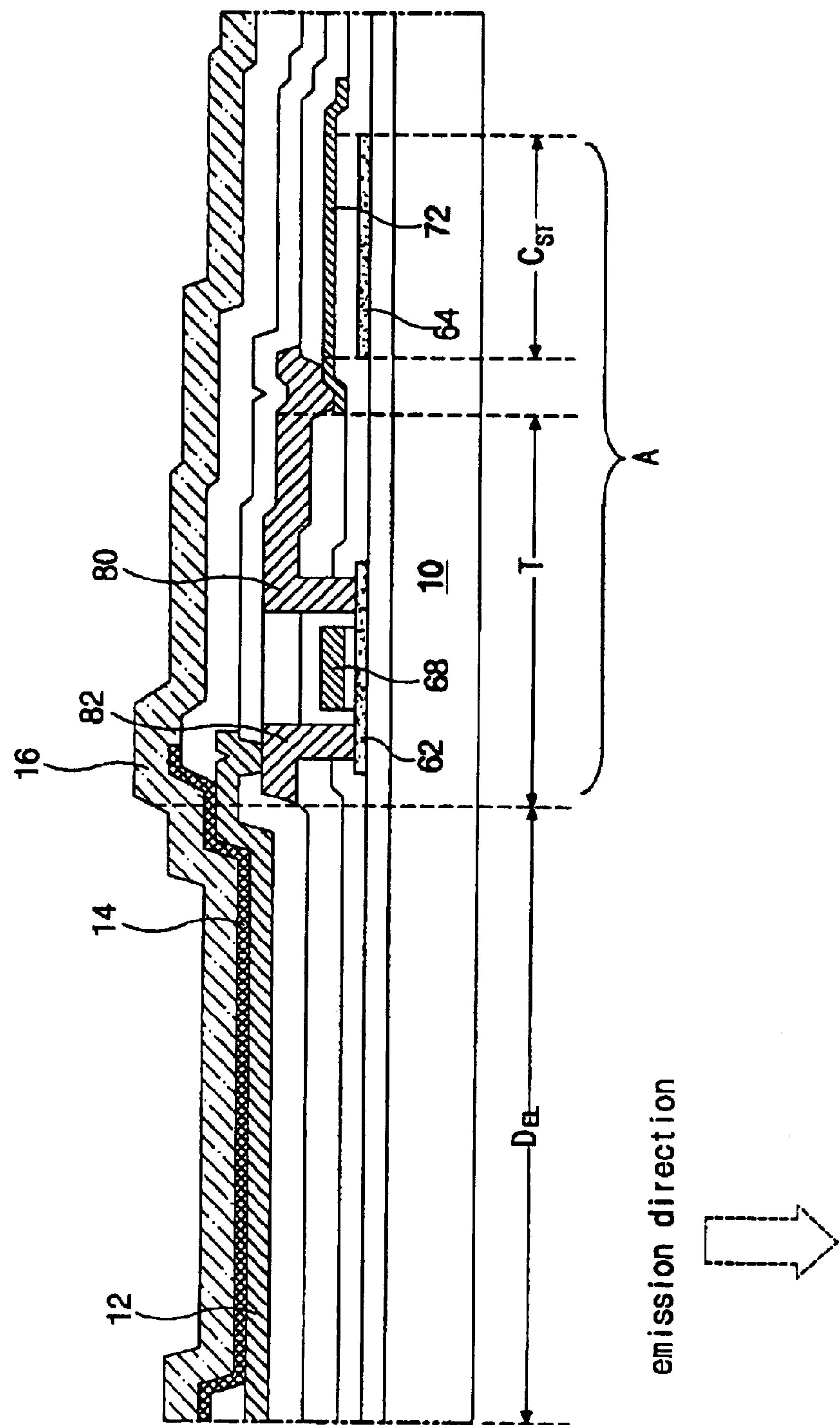
FIG. 3 is a cross sectional view of a sub-pixel region of a bottom emission-type organic electroluminescent display device according to the related art.
Figure 4:
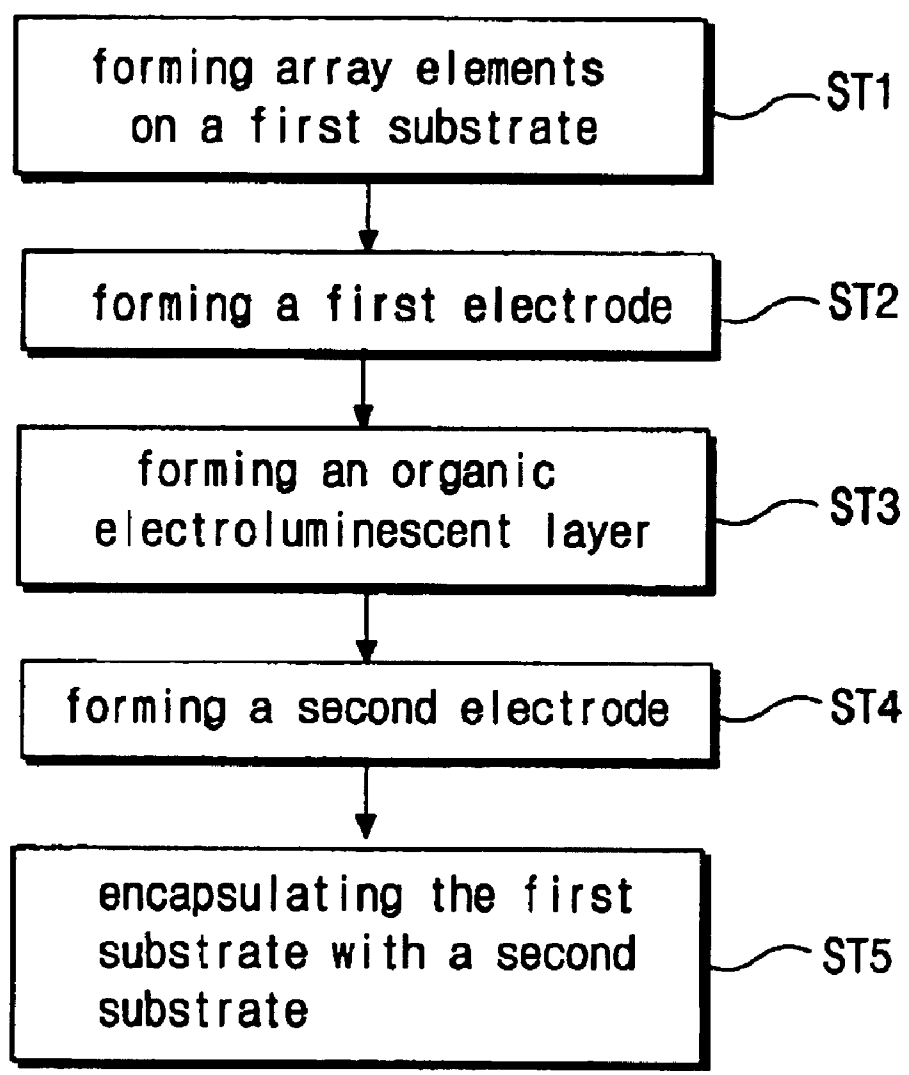
FIG. 4 is a flow chart of a fabricating process of an organic electro-luminescent display device according to the related art.
Figure 5:
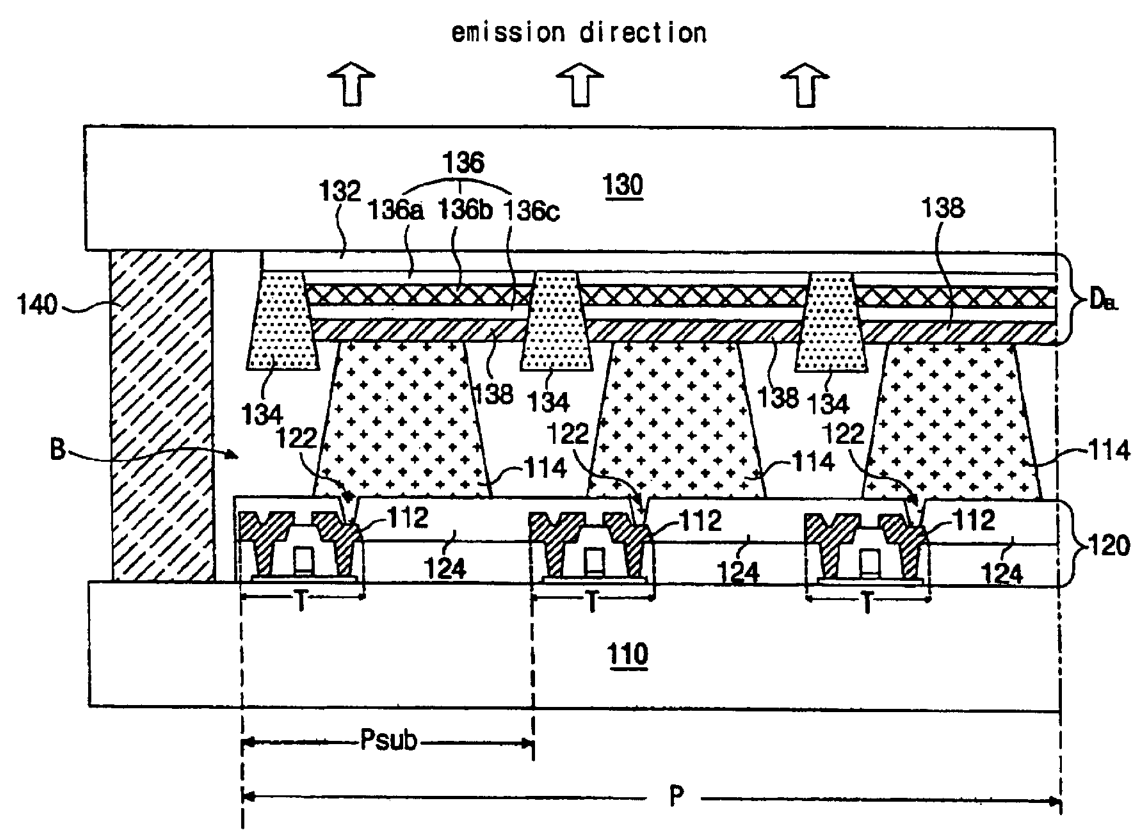
FIG. 5 is a cross sectional view of an exemplary active matrix organic electro-luminescent display device according to the present invention.

FIG. 5 is a cross sectional view of an exemplary active matrix organic electroluminescent display device according to the present invention. In FIG. 5, a first substrate 110 and a second substrate 130 may be spaced apart and face each other, and a seal pattern 140 may be formed along a peripheral portion between the first and second substrates 110 and 130. Array elements 120 may be formed on an inner surface of the first substrate 110, and organic electroluminescent (EL) diodes "$D_{EL}$" may be formed on an inner surface of the second substrate 130. The organic EL diode "$D_{EL}$" may include a first electrode 132, an organic EL layer 136, and a second electrode 138, wherein the first electrode 132 may be formed on the inner surface of the second substrate 130 to function as a common electrode. A partition wall 134 may be formed on the first electrode 132, and may be disposed along a border portion between adjacent sub-pixels "$P_{sub}$" as a separator of the second electrode 138. The organic EL layer 136 may be formed on the first electrode 132 between the adjacent partition walls 134, and the second electrode 138 may be formed on the organic EL layer 136 at each sub-pixel region "$P_{sub}$."

The organic EL layer 136 may include a first organic material layer **136*a*, an emission layer 136*b*, and a second organic material layer 136*c*. The first organic material layer 136*a* may be formed on the first electrode 132, and the emission layer 136*b* may be formed on the first organic material layer 136*a* to include one of red, green, and blue disposed at each sub-pixel region "$P_{sub}$." The second organic material layer 136*c* may be formed on the emission layer 136*b*, wherein an EL material of the first and second organic material layers 136*a* and 136*c* may be determined according to a disposition of anode and cathode electrodes. When the first and second electrodes 132 and 138 are designed as the cathode and anode electrodes, respectively, for example, the first organic material layer 136*a* may include an electron injection layer and an electron transporting layer, and the second organic material layer 136*c*** may include a hole injection layer and a hole transporting layer.

The array elements 120 may include a thin film transistor (TFT) "T" that may be formed on the first substrate 110 by the sub-pixel region "$P_{sub}$." A connection pattern 114 may also be formed by the sub-pixel "$P_{sub}$" over the first substrate 110 including the TFT "T," wherein the connection pattern 114 connects the second electrode 138 to the TFT "T" in order to supply currents to the organic EL diode "$D_{EL}$." While electrically connecting the organic EL diode "$D_{EL}$" to the TFT "T," the connection pattern 114 may maintain a uniform gap between the first and second substrates 110 and 130. The connection pattern 114 may include a columnar shape, and may be connected to a drain electrode 112 of the TFT "T" through a drain contact hole 122 formed in a passivation layer 124 to cover the TFT "T." The connection pattern 114 may be connected to a source electrode of the TFT "T" or to an additional metal pattern connected to the TFT "T." The TFT "T" may be a driving TFT connected to the organic EL diode "$D_{EL}$." The connection pattern 114 may include a conductive material, such as a ductile metallic material having a low resistivity, and may be formed during a process of forming the array elements 120 on the first substrate 110.

The organic EL device shown in FIG. 5 may be a top emission-type device where light is emitted through the second substrate 130. Accordingly, the first electrode 132 may include a transparent conductive material or a half transparent conductive material, and the second electrode 138 may include an opaque conductive material. Preferably, a space "B" between the array elements 120 and the second electrode 138 may be filled with an inert gas, such as nitrogen gas ($N_2$).

Although not shown, the array elements 120 may also include a scanning line, a signal line, a power line, a switching TFT, and a storage capacitor. The signal line and the power line may be spaced apart from each other to cross the scanning line, and the switching TFT may be disposed at a crossing of the scanning line and the signal line. Thus, a first substrate having array elements and a second substrate having an organic EL diode may be individually provided. In addition, the OELD device may be a top emission-type device where light is emitted through the second substrate. Accordingly, a structure of high aperture ratio and high resolution can be obtained where the production yield is improved. Since the OELD device efficiently blocks the ambient air, the OELD device is reliable. Moreover, degrees of freedom for arranging the TFT may be increased, and selection of the material for the first electrode may be varied. Furthermore, TFTs having other structures may be used except for a top gate structure, as shown in FIG. 5.

Figure 6:
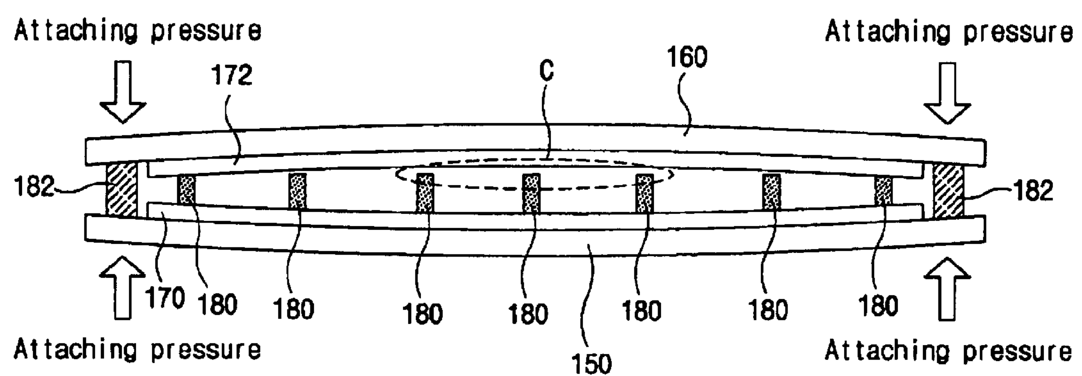
FIG. 6 is a cross sectional view of another exemplary active matrix organic electro-luminescent display device according to the present invention.

FIG. 6 is a cross sectional view of another exemplary active matrix organic electroluminescent display device according to the present invention. In FIG. 6, a first substrate 150 and a second substrate 160 may be spaced apart and face each other. A seal pattern 182 may be formed along a peripheral portion between the first and second substrates 150 and 160 to attach the first and second substrates 150 and 160 to each other. The seal pattern 182 may have a closed pattern without any openings. Array elements 170 may be formed on an inner surface of the first substrate 150 and organic electro-luminescent (EL) diodes 172 may be formed on an inner surface of the second substrate 160. The organic EL diodes 172 may be connected to the array elements 170 through connection patterns 180 that are formed between the array elements 170 and the organic EL diodes 172.

When attaching the first and second substrates 150 and 160, a portion corresponding to the seal pattern 182 may be mechanically pressed. Accordingly, first regions between the first and second substrates 150 and 160 far away from the seal pattern 182 may have a lower internal pressure than second regions adjacent to the seal pattern 182. Thus, the first regions between the first and second substrates 150 and 160 far away from the seal pattern 182 may have a larger volume than the second regions adjacent to the seal pattern 182. Accordingly, bonding of the first and second substrates 150 and 160 may be poor due to a lack of compression of the connection patterns within a space "C," whereby the organic EL diode 172 and the connection pattern 180 may be disconnected from each other. Accordingly, currents may not be adequately supplied to the organic EL diode 172 due to the poor connections, and image display quality may be poor since light is not emitted in the corresponding sub-pixel regions. This is commonly referred to as a pixel defect.

On the other hand, wherein the connection patterns 180 are weakly connected to the organic EL diode 172, the OELD device may be partially degraded due to localized generation of heat by the currents. Accordingly, spots may occur if the OELD is driven for long periods time.

Figure 7:
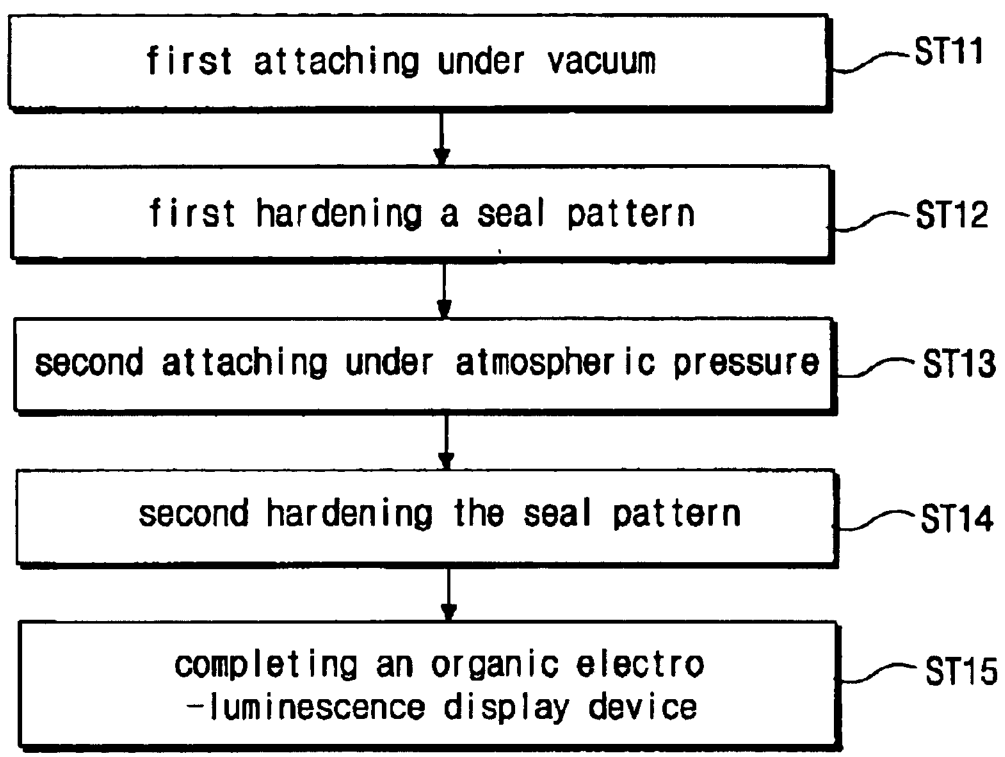
FIG. 7 is a flow chart of an exemplary attachment process of an organic electro-luminescent display device according to the present invention.

FIG. 7 is a flow chart of an exemplary attachment process of an organic electroluminescent display device according to the present invention. At step ST11, in a vacuum condition, a first substrate that includes array elements and connection patterns and a second substrate that includes organic EL diodes may be initially attached. A seal pattern may be formed along a peripheral portion between the first and second substrates, and the first and second substrates may be attached together by mechanical pressing the seal pattern. The vacuum condition may be maintained by using a vacuum chamber having a gas injecting portion and an exhaust port. For example, the pressure within the vacuum chamber may be within a range of about 0.3 torr to about 0.7 torr, and may be controlled by an amount of gas flowing into the chamber.

At step ST12, the seal pattern between the initially attached substrates may be initially hardened. Accordingly, during subsequent processing steps, the seal pattern may be prevented from flowing into a space between the first and second substrates.

At step ST13, the initially attached first and second substrates may be finally attached. For example, the gas within the vacuum chamber may be exhausted, and an internal pressure of the vacuum chamber may be increased to atmospheric pressure. Thus, a space between the initially bonded first and second substrates may have a pressure lower than the atmospheric pressure inside of the vacuum chamber. Accordingly, the lower pressure within the space between the first and second substrates may function as a bonding force. In addition, since the pressure of the space between the bonded first and second substrates may be lower than the atmospheric pressure inside the vacuum chamber, a uniform pressure provided across an entire surface of the bonded first and second substrates. Accordingly, bending of the substrates may be prevented, thereby improving contact of the organic EL diodes and the connection patterns.

At step ST14, after the first and second substrates are finally attached, the seal pattern may be additionally hardened.

At step ST15, after the seal pattern is additionally hardened, fabrication of the OELD device may be complete. However, additional process steps may be added to further fabricate the OELD device.

Figure 8:
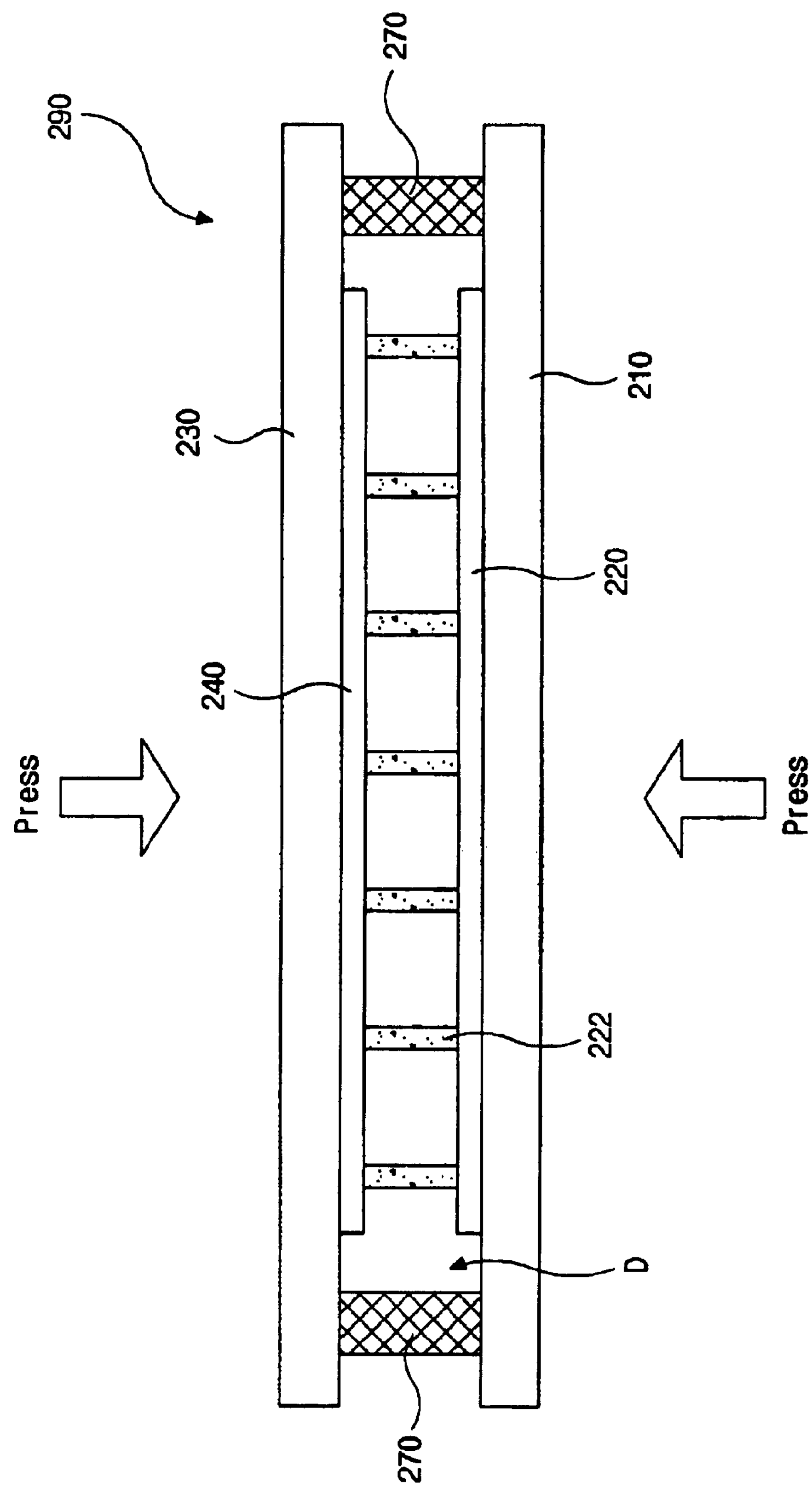
FIG. 8 is a cross sectional view of an exemplary attachment apparatus of an organic electroluminescent display device according to the present invention.

FIG. 8 is a cross sectional view of an exemplary attachment apparatus of an organic electroluminescent display device according to the present invention. In FIG. 8, array elements 220 and connection patterns 222 may be formed on an inner surface of a first substrate 210, and organic EL diodes 240 may be formed on an inner surface of a second substrate 230. The organic EL diodes 240 may be electrically connected to the array elements 220 through the connection patterns 222. A seal pattern 270 may be formed along a peripheral portion between the first and second substrates 210 and 230 to surround the array elements 220, the connection patterns 222, and the organic EL diodes 240. In addition, an interior space "D" between the first and second substrates 210 and 230 may have a lower pressure than an exterior of the OELD device 290. Thus, pressure is applied across an entire surface of the substrates 210 and 230 during a bonding process, whereby bonding of the organic EL diodes 240 and the connection patterns 222 is improved. Although not shown, the array elements 220 may include a TFT positioned by sub-pixel regions, and the organic EL diodes may include an organic electroluminescent layer and an electrode patterned by the sub-pixel regions.

It will be apparent to those skilled in the art that various modifications and variations can be made in the organic electroluminescent display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. An organic electroluminescent display device, comprising:

a first substrate;

a second substrate spaced apart from and facing the first substrate to form a space therebetween, the first and second substrates include a pixel region having sub-pixel regions;

an array element on an inner surface of the first substrate;

an organic electroluminescent diode on an inner surface of the second substrate, the organic electroluminescent diode includes a first electrode, an organic electroluminescent layer, and a second electrode positioned by the sub-pixel regions;

a seal pattern along a peripheral portion between the first and second substrates;

a plurality of partition walls formed on the second substrate each adjacent to the organic electroluminescent diode; and a connection pattern electrically interconnecting the array element and the organic electroluminescent diode, and positioned between the plurality of partition walls, the connection pattern connects the thin film transistor and the second electrode adjacent to the sub-pixel regions, wherein a pressure within the space between the first and second substrates is lower than an ambient atmospheric pressure.

2. The device according to claim 1, wherein the sub-pixel regions include red, green, and blue.

3. The device according to claim 2, wherein the array element includes a thin film transistor formed adjacent to the sub-pixel regions.

4. The device according to claim 1, wherein the first electrode functions as a cathode electrode.

5. The device according to claim 4, wherein the first electrode includes a transparent conductive material.

6. The device according to claim 1, wherein the second electrode functions as an anode electrode.

7. The device according to claim 6, wherein the second electrode includes a transparent conductive material.

8. The device according to claim 1, wherein the connection pattern includes a metallic material.

9. The device according to claim 1, wherein the connection pattern includes a columnar shape.

* * * * *